(12) United States Patent
Ho et al.

(10) Patent No.: US 8,878,048 B2
(45) Date of Patent: Nov. 4, 2014

(54) SOLAR CELL STRUCTURE INCLUDING A SILICON CARRIER CONTAINING A BY-PASS DIODE

(75) Inventors: Frank F. Ho, Yorba Linda, CA (US); Charles Hyunsang Suh, Irvine, CA (US)

(73) Assignee: The Boeing Company, Chicago, IL (US)

(*) Notice: Subject to any disclaimer, the term of this patent is extended or adjusted under 35 U.S.C. 154(b) by 324 days.

(21) Appl. No.: 12/781,219

(22) Filed: May 17, 2010

(65) Prior Publication Data
US 2011/0277820 A1    Nov. 17, 2011

(51) Int. Cl.
| | |
|---|---|
| H01L 31/042 | (2014.01) |
| H01L 31/18 | (2006.01) |
| H01L 27/142 | (2014.01) |
| H01L 31/0687 | (2012.01) |
| H01L 31/0725 | (2012.01) |
| H01L 31/02 | (2006.01) |
| H01L 31/0735 | (2012.01) |

(52) U.S. Cl.
CPC ........ *H01L 31/02021* (2013.01); *H01L 31/184* (2013.01); *H01L 31/1892* (2013.01); *H01L 31/1844* (2013.01); *H01L 27/1421* (2013.01); *Y02E 10/544* (2013.01); *H01L 31/1852* (2013.01); *H01L 31/06875* (2013.01); *H01L 31/0725* (2013.01); *H01L 31/0735* (2013.01)
USPC ...................................... 136/244

(58) Field of Classification Search
CPC ............ H01L 51/425; H01L 31/02008; H01L 31/0201; H01L 31/02013; H01L 31/02021; H01L 31/022425; H01L 31/022433; H01L 31/068; H01L 31/0684; H01L 31/05; H01L 31/06875; H01L 31/0687; H01L 31/076; H01L 31/077; H01L 27/142; H01L 27/1421; Y02E 10/50; Y02E 10/544; Y02E 10/548; Y02E 10/20; Y02E 10/12; Y02E 10/566; Y02E 10/547; H02J 7/35
USPC .................................................. 136/243–265
See application file for complete search history.

(56) References Cited

U.S. PATENT DOCUMENTS

| 4,152,535 A | 5/1979 | Deminet et al. |
| 4,392,451 A | 7/1983 | Mickelsen et al. |

(Continued)

FOREIGN PATENT DOCUMENTS

| EP | 0369666 | 5/1990 |
| JP | 61-067968 | 4/1986 |
| WO | 2010/111295 | 9/2010 |

OTHER PUBLICATIONS

Sundaram et al., "GaAs Solar Cell Using an Aleternative Arsenic Source," *Material Research Society Symposium Proceedings*, vol. 145, 1989, pp. 211-215.

(Continued)

*Primary Examiner* — Jeffrey T Barton
*Assistant Examiner* — Eric R Smith
(74) *Attorney, Agent, or Firm* — Kevin G. Fields

(57) ABSTRACT

A solar cell structure including a silicon carrier defining a front side and a back side, and including an N-type portion having an exposed portion on the front side of the carrier and a P-type portion having an exposed portion on the front side of the carrier, the N-type portion and the P-type portion defining a P-N junction, and a solar cell defining a front side and a back side, wherein the solar cell is connected to the front side of the carrier such that the back side of the solar cell is electrically coupled to the exposed portion of the N-type portion, and wherein the front side of the solar cell is electrically coupled to the exposed portion of the P-type portion.

7 Claims, 11 Drawing Sheets

(56) References Cited

U.S. PATENT DOCUMENTS

| | | | |
|---|---|---|---|
| RE31,968 E | 8/1985 | Mickelsen et al. | |
| 4,833,317 A | 5/1989 | Huggins | |
| 4,935,067 A * | 6/1990 | Sato et al. | 136/255 |
| 5,217,539 A | 6/1993 | Fraas et al. | |
| 5,248,346 A | 9/1993 | Fraas et al. | |
| 5,330,583 A * | 7/1994 | Asai et al. | 136/251 |
| 5,389,158 A | 2/1995 | Fraas et al. | |
| 5,543,627 A | 8/1996 | Huggins | |
| 5,616,185 A * | 4/1997 | Kukulka | 136/244 |
| 5,928,437 A | 7/1999 | Dillard | |
| 5,949,212 A | 9/1999 | Cherry | |
| 6,248,948 B1 * | 6/2001 | Nakagawa et al. | 136/244 |
| 6,255,580 B1 | 7/2001 | Karam et al. | |
| 6,313,396 B1 | 11/2001 | Glenn | |
| 6,531,653 B1 | 3/2003 | Glenn et al. | |
| 6,586,669 B2 | 7/2003 | King et al. | |
| 6,784,358 B2 | 8/2004 | Kukulka | |
| 6,951,819 B2 | 10/2005 | Hes et al. | |
| 7,082,019 B2 | 7/2006 | Bodeau et al. | |
| 7,335,835 B2 | 2/2008 | Kukulka et al. | |
| 7,592,536 B2 | 9/2009 | Glenn | |
| 7,659,474 B2 | 2/2010 | Joslin et al. | |
| 7,732,706 B1 * | 6/2010 | Mardesich | 136/261 |
| 2004/0089339 A1 | 5/2004 | Kukulka et al. | |
| 2005/0072457 A1 * | 4/2005 | Glenn | 136/246 |
| 2006/0021565 A1 | 2/2006 | Zahler et al. | |
| 2007/0113884 A1 | 5/2007 | Kinsey et al. | |
| 2008/0000523 A1 * | 1/2008 | Hilgarth et al. | 136/255 |
| 2008/0128014 A1 * | 6/2008 | Van Riesen et al. | 136/244 |
| 2008/0149173 A1 | 6/2008 | Sharps | |
| 2009/0025778 A1 * | 1/2009 | Rubin et al. | 136/246 |
| 2009/0078308 A1 * | 3/2009 | Varghese et al. | 136/255 |
| 2009/0223555 A1 | 9/2009 | Ammar | |

OTHER PUBLICATIONS

European Search Report, European Application No. 11166452.0 (Feb. 6, 2013).

* cited by examiner

SOLAR CELL STRUCTURE INCLUDING A SILICON CARRIER CONTAINING A BY-PASS DIODE

GOVERNMENT CONTRACT

The inventions claimed herein were made with Government support under Contract Number HR0011-08-C-0086 awarded by the Air Force. The Government of the United States may have certain rights in the claimed inventions.

FIELD

This application relates to solar cell structures and, more particularly, to solar cell structures that include a by-pass diode.

BACKGROUND

To date, the highest conversion efficiencies achieved for monolithically-grown, series-connected, multi junction solar cells uses semiconductors with selected energy bandgaps, grown with atomic lattice spacing closely matched to that of the growth substrate. The top two subcells use $Ga_xIn_{(1-x)}P$ where x is around 0.5, giving bandgap 1.85-1.95 eV for the top subcell. The next mid-cell uses $In_xGa_{(1-x)}As$ with low In content, providing bandgap 1.38-1.43 eV. Higher efficiencies of the germanium (Ge) subcell is replaced by a subcell with bandgap between 0.95-1.05 eV of higher content indium of $In_xGa_{(1-x)}As$. The solar spectrum is more effectively matched if a fourth subcell with lower bandgap is included. These two lower subcells use $In_xGa_{(1-x)}As$ where x extends from 0.0 to 0.3. The lattice-mismatch of these lower cells to Ge or GaAs growth substrate can be between 2% and 5%, and can be potentially mitigated by lattice-grading or annealing schedules. The loss in output from lattice-mismatch is offset by the better use of the solar spectrum and the increased voltage. If the lower subcells are grown first, lattice-mismatch reduces the output of the top two cells, which provides 75-85% of the multi junction cell output. To avoid these mismatch effects on the top two subcells, inverted multi junction cells are grown, with the top subcells are grown first and lattice closely matched to the Ge or GaAs growth substrate. The lower subcells are grown with mismatched, but the improved energy gap selection can offset the loss in performance resulting from the mismatch, and some mitigation is possible.

A typical solar cell includes two semiconductor layers in facing contact at a semiconductor junction. When illuminated by the sun or otherwise, the solar cell produces a voltage across the semiconductor layers. More advanced solar cells may include three or more semiconductor layers that define multiple junctions.

The voltage and current output of a solar cell are limited by the materials of construction and the active surface area of the solar cell structure. Therefore, multiple solar cells are typically electrically interconnected, such as in series, to form a circuit that produces higher voltages than are possible with a single solar cell. A typical solar panel is formed by electrically connecting several circuits, such as in parallel or in series, to produce higher currents or higher voltages. A solar array may be formed as a combination of solar panels. Solar arrays are now used in space and terrestrial applications.

A circuit of solar cells works well when all of the solar cells are illuminated with generally the same illumination intensity. However, if one of the solar cells is shaded while the others remain fully illuminated, the shaded solar cell is subjected to a reverse-bias condition by the continuing voltage and current output of the remaining solar cells.

By-pass diodes are used to protect against the damage arising during the reverse-bias condition. A by-pass diode blocks current when the solar cell is not reverse biased, but passes the impressed current when the solar cell is reverse biased.

While certain techniques for incorporating by-pass diodes into solar cells are known, those skilled in the art continue to seek new ways of incorporating by-pass diodes into solar cell structures.

SUMMARY

Disclosed is a carrier, attached after the growth of the cell layers. The carrier includes suitably patterned P-N junction, which with contacts and bonding methods, provides a bypass diode to each multi junction cell structure. Several alternative solutions of connecting contacts are given below. All of the advantages of an inverted metamorphic cell are preserved and minimum degradation of performance occurs if shadowing occurs on the solar array.

In one aspect, the disclosed solar cell structure may include a silicon carrier defining a front side and a back side, and including an N-type portion having an exposed portion on the front side of the carrier and a P-type portion having an exposed portion on the front side of the carrier, the N-type portion and the P-type portion defining a P-N junction, and a solar cell defining a front side and a back side, wherein the solar cell is connected to the front side of the carrier such that the back side of the solar cell is electrically coupled to the exposed portion of the N-type portion, and wherein the front side of the solar cell is electrically coupled to the exposed portion of the P-type portion.

In another aspect, the disclosed solar cell structure may include a silicon carrier defining a front side and a back side, and comprising an N-type portion having an exposed portion on the front side of the carrier and a P-type portion having an exposed portion on the back side of the carrier, the N-type portion and the P-type portion defining a P-N junction, and a solar cell defining a front side and a back side, wherein the solar cell is connected to the front side of the carrier such that the back side of the solar cell is electrically coupled to the exposed portion of the N-type portion, and a metallization layer that electrically couples the front side of the solar call to the exposed portion of the P-type portion.

In another aspect, disclosed is a method for assembling a solar cell structure. The method may include the steps of (1) providing a silicon carrier having a front side and a back side, (2) providing a solar cell having a front side and a back side, wherein the back side of the solar cell includes a first metallization layer connected thereto, (3) forming a P-N junction in the carrier such that the carrier includes a P-type portion and an N-type portion, (4) forming a second metallization layer on the front side of the carrier, the second metallization layer being electrically coupled to the N-type portion, (5) connecting the first metallization layer to the second metallization layer to form a metal-to-metal bond between the solar cell and the carrier, and (6) electrically coupling the front side of the solar cell to the P-type portion.

In yet another aspect, the disclosed method for assembling a solar cell structure may include the steps of (1) providing a silicon carrier having a front side and a back side, (2) providing a solar cell having a front side and a back side, wherein the back side of the solar cell includes a first metallization layer connected thereto, (3) forming a P-N junction in the carrier such that the carrier includes a P-type portion exposed on the back side of said carrier and an N-type portion exposed on the front and the back sides of the carrier, (4) forming a second metallization layer on the front side of the carrier, the second metallization layer being electrically coupled to the N-type portion, (5) connecting the first metallization layer to the second metallization layer to form a metal-to-metal bond between the solar cell and the carrier, and (6) forming a third metallization layer that electrically couples the front side of the solar cell to the P-type portion on the back side of the carrier.

Other aspects of the disclosed solar cell structure with integral by-pass diode and methods for assembling the same will become apparent from the following description, the accompanying drawings and the appended claims.

DETAILED DESCRIPTION

Figure 1:
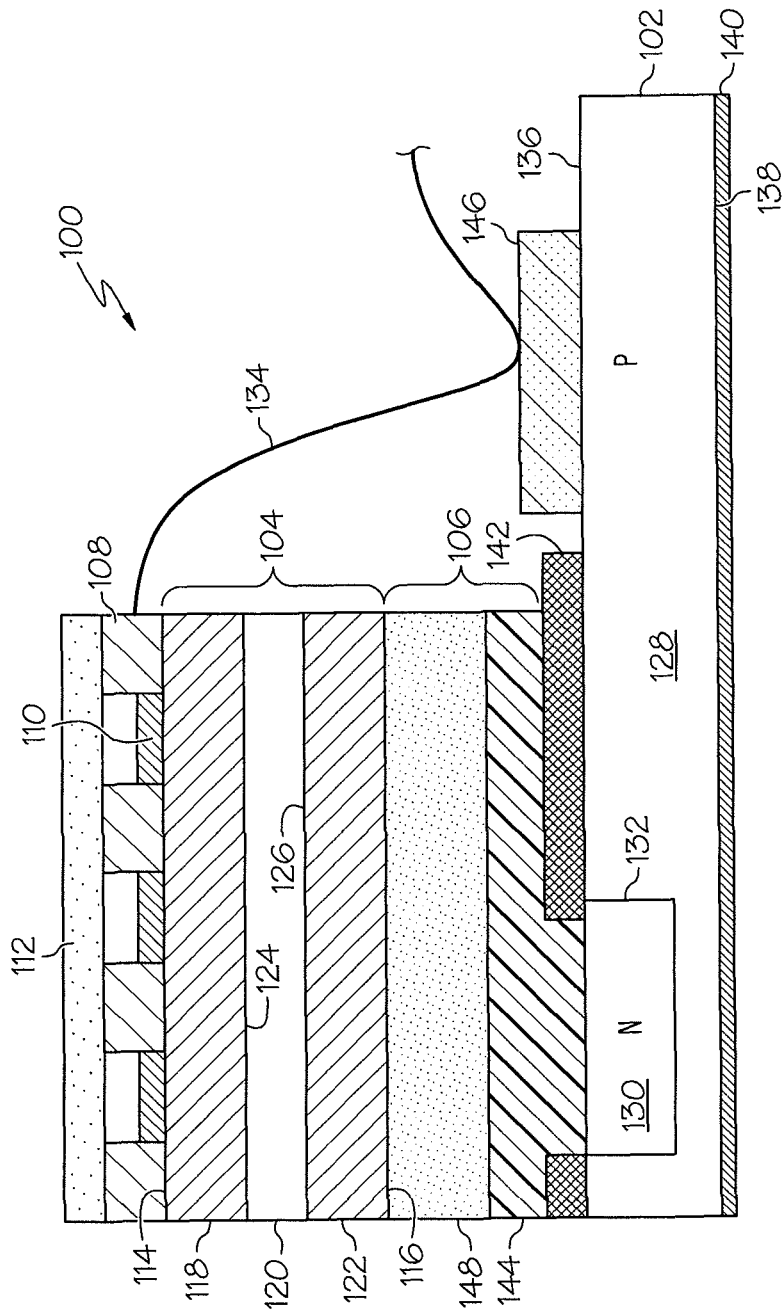
FIG. 1 is a side elevational view, in section, of a first aspect of the disclosed solar cell structure with integral by-pass diode.

Referring to FIG. 1, a first aspect of the disclosed solar cell structure, generally designated 100, may include a carrier 102 and a solar cell 104 connected to the carrier 102 by way of a metal-to-metal bond 106. The solar cell structure 100 may also include additional layers, such as a front contact metallization layer 108 (e.g., a grid), an anti-reflecting coating layer 110 and a cover glass layer 112, among other possible additional layers.

The solar cell 104 may include a front side 114 and a back side 116, and may produce a voltage across the front side 114 and the back side 116 when the front side 114 is illuminated (e.g., by the sun). The solar cell 104 may include multiple layers 118, 120, 122 of semiconductor material that define junctions 124, 126 therebetween. As discussed below, in one particular implementation, the solar cell 104 may be an inverted metamorphic solar cell.

The carrier 102 may include a portion of P-type semiconductor material 128 and a portion of N-type semiconductor material 130, thereby defining a P-N junction 132 in the carrier 102. The front side 114 of the solar cell 104 may be electrically coupled to the portion of P-type semiconductor material 128 of the carrier 102 (e.g., by way of an interconnect 134) and the back side 116 of the solar cell 104 may be electrically coupled to the portion of N-type semiconductor material 130 of the carrier 102, thereby advantageously configuring the carrier 102 as a diode, specifically, a by-pass diode.

In one particular implementation, the carrier 102 may be a generally flat, planar structure, such as a wafer, and may include a front side 136 and a back side 138. Both the P-type portion 128 and the N-type portion 130 of the carrier 102 may be exposed on the front side 136 of the carrier 102. The back side 138 of the carrier 102 may include a first layer of insulation 140. A second layer of insulation 142 may be provided on a portion of the front side 136 of the carrier 102 to electrically isolate the back side 116 of the solar cell 104 from the P-type portion 128 of the carrier 102.

Figure 7:
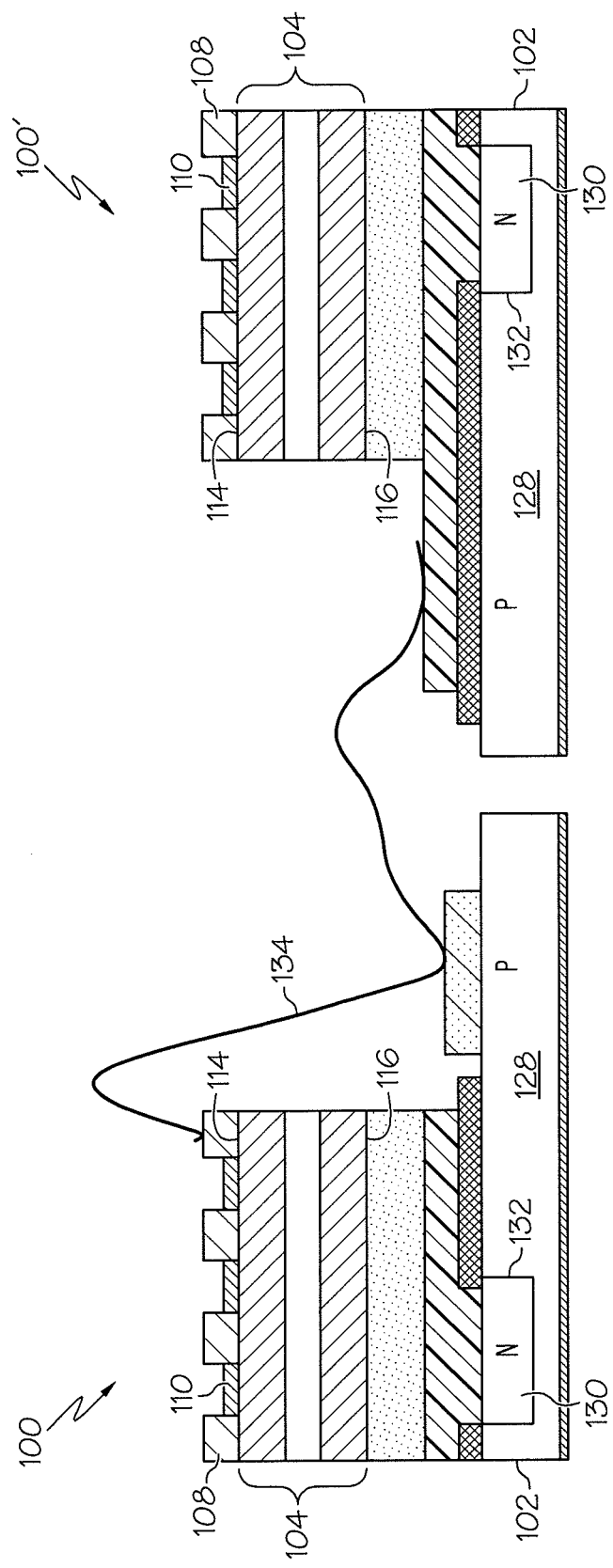
FIG. 7 is a side elevational view, in section, of the solar cell structure of FIG. 1 electrically coupled, in series, to another solar cell structure.

Thus, as shown in FIG. 7, the solar cell structure 100 may be arranged in an array with other like solar cell structures 100' by using interconnects 134 in an all-front-contact configuration to electrically couple the front side 114 of the solar cell 104 and the P-type portion 128 of solar cell structure 100 with the back side 116 of the solar cell 104 of an adjacent solar cell structure 100'.

Figure 13:
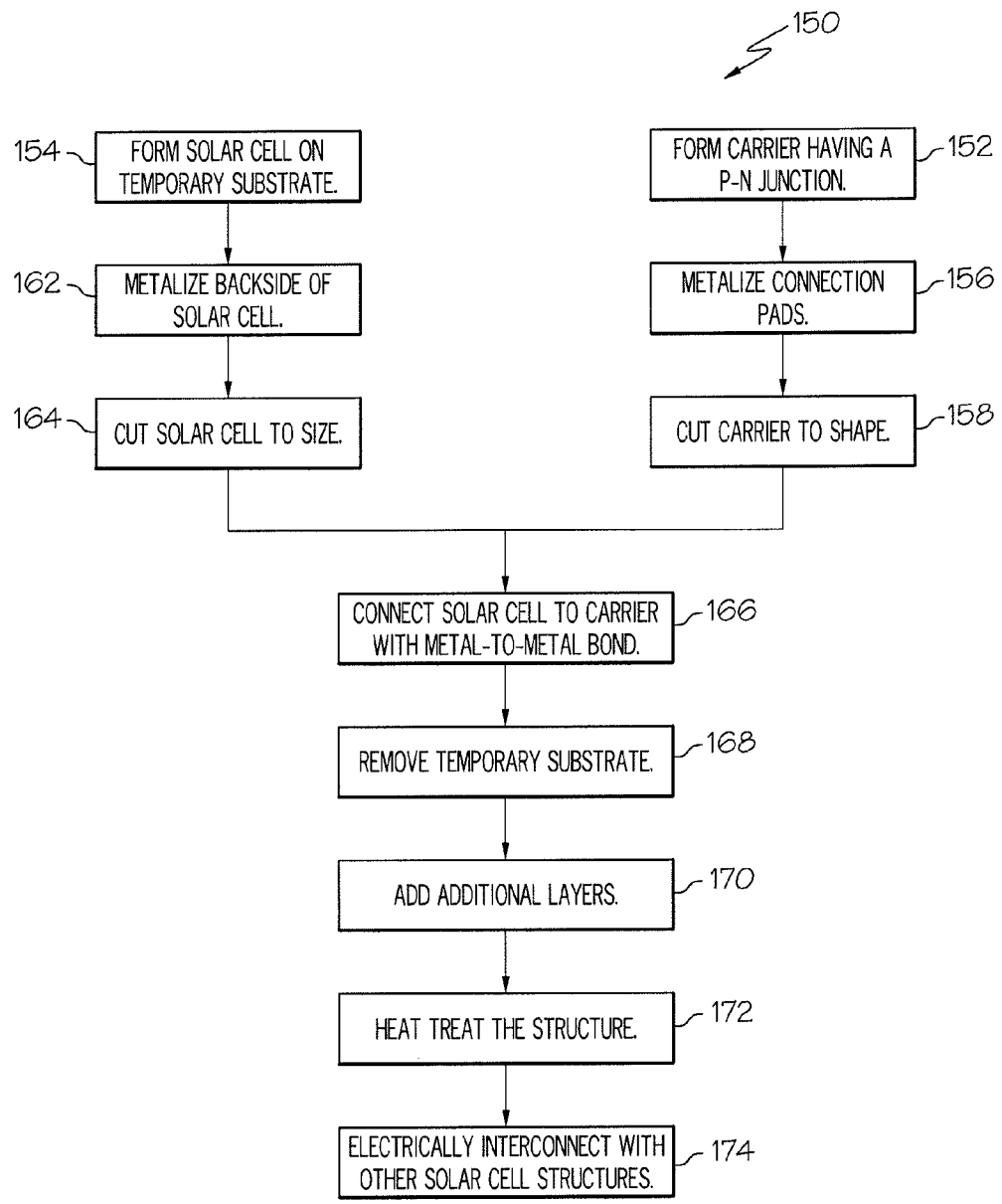
FIG. 13 is a flowchart illustrating a method for assembling the solar cell structure of FIG. 1.

One aspect of the disclosed method for forming solar cell structure 100 is illustrated in FIG. 13 and generally designated 150. The method 150 may begin with the separate formation of the carrier 102 (step 152) and the solar cell 104 (step 154).

The carrier 102 (FIG. 1) may be formed from a silicon material, such as single crystal silicon or polycrystalline silicon. At this point, those skilled in the art will appreciate that the use of a silicon material to form the carrier 102 may be advantageous for numerous reasons, including the low cost of silicon, the relative flexibility of silicon, the ease of forming P-N junctions in silicon, among other reasons.

The P-N junction 132 in the carrier 102 may be formed using any available technique, including diffusion techniques and growth techniques (e.g., chemical vapor deposition). In one example, the carrier 102 may be formed by starting with a P-type silicon wafer and diffusing a dopant relative to the P-type silicon wafer to form the portion of N-type semiconductor material 130 on the wafer and, thus, the P-N junction 132. In another example, the carrier 102 may be formed by starting with an N-type silicon wafer and diffusing a dopant relative to the N-type silicon wafer to form the portion of P-type semiconductor material 128 and, thus, the P-N junction 132.

Figure 2:
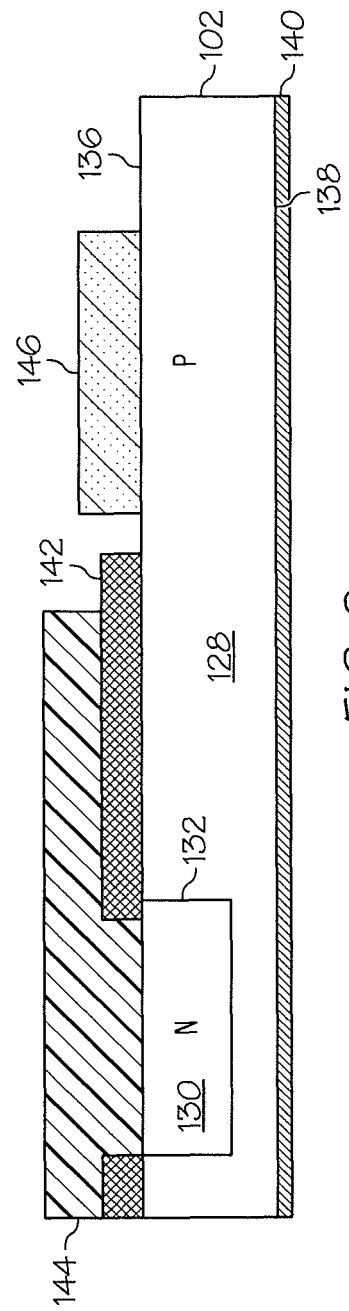
FIG. 2 is a side elevational view, in section, of a carrier of the solar cell structure of FIG. 1, shown with metallization and insulation layers applied thereto.

Once the carrier 102 has been formed in step 152 (FIG. 13), the method may proceed to step 156 (FIG. 13), wherein metallization layers may be formed on the carrier 102. Specifically, referring to FIG. 2, a first connected pad 144 may be metalized on the front surface 136 of the carrier 102 to electrically contact the N-type portion 130 of the carrier 102 and a second connection pad 146 may be metalized on the front surface 135 of the carrier 102 to electrically contact the P-type portion 128 of the carrier 102. Insulation layer 142 may electrically isolate the first connection pad 144 from the P-type portion 128 of the carrier. Insulation layer 140 may be applied to the back side 138 of the carrier.

With the formation, metallization and insulation of carrier 102 complete, the carrier 102 may be cut to the desired shape and size, as shown in step 158 (FIG. 13).

Figure 3:
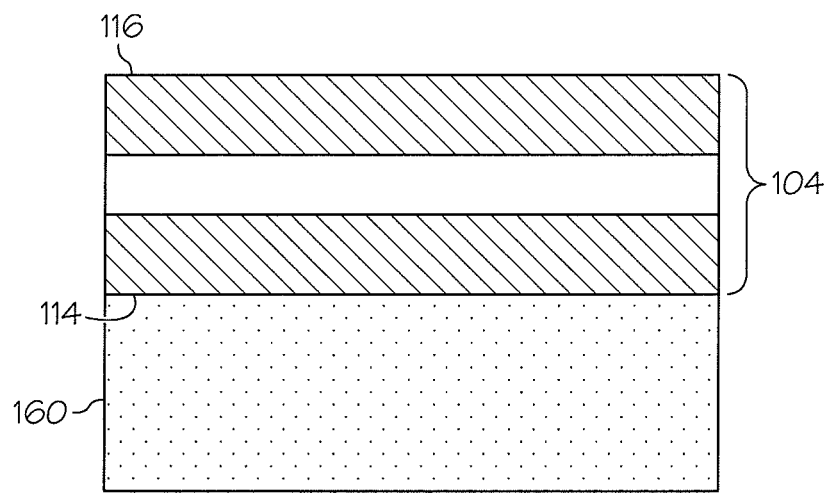
FIG. 3 is a side elevational view, in section, of an inverted metamorphic solar cell used to form the solar cell structure of FIG. 1.

At step 154 (FIG. 13), the solar cell 104 may be initially formed on a temporary substrate 160 with the front side 114 of the solar cell 104 mated with the temporary substrate 160, as shown in FIG. 3. For example, the temporary substrate 160 may be germanium and the solar cell 104 may be an inverted metamorphic solar cell that has been epitaxially grown on the germanium substrate 160, as is known in the art. Other techniques may be used to form the solar cell 104 on the temporary substrate 160 without departing from the scope of the present disclosure.

Figure 4:
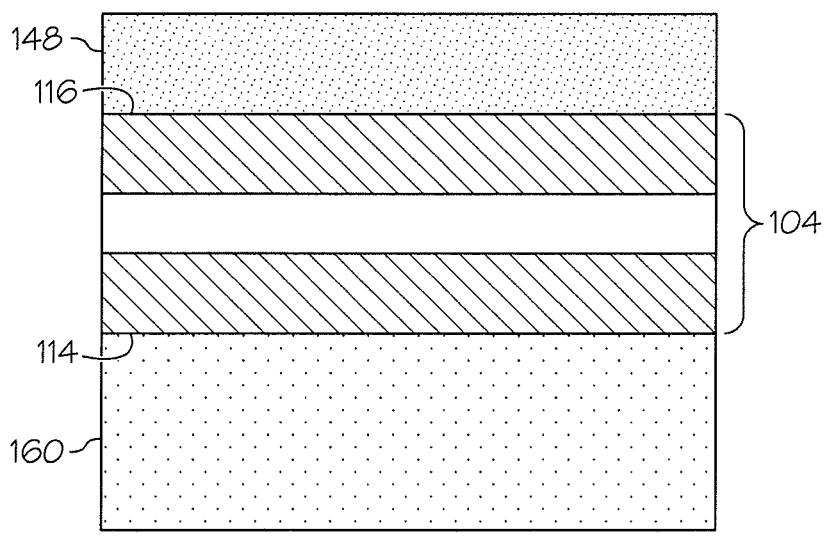
FIG. 4 is a side elevational view, in section, of the inverted metamorphic solar cell of FIG. 3, shown with an additional metallization layer.

At step 162 (FIG. 13), a metallization layer 148 may be layered over the back side 116 of the solar cell 104, as shown in FIG. 4. While metallization layers are well known in the art, examples of appropriate materials for metallization layer 144 and metalized connection pads 146, 148 include gold, silver and alloys thereof, among other possible metallization metals. With the metallization of the solar cell 104 complete, the solar cell 104 and associated metallization layer 148 and temporary substrate 160 may be cut to the desired size and shape, a shown in step 164 (FIG. 13).

Figure 5:
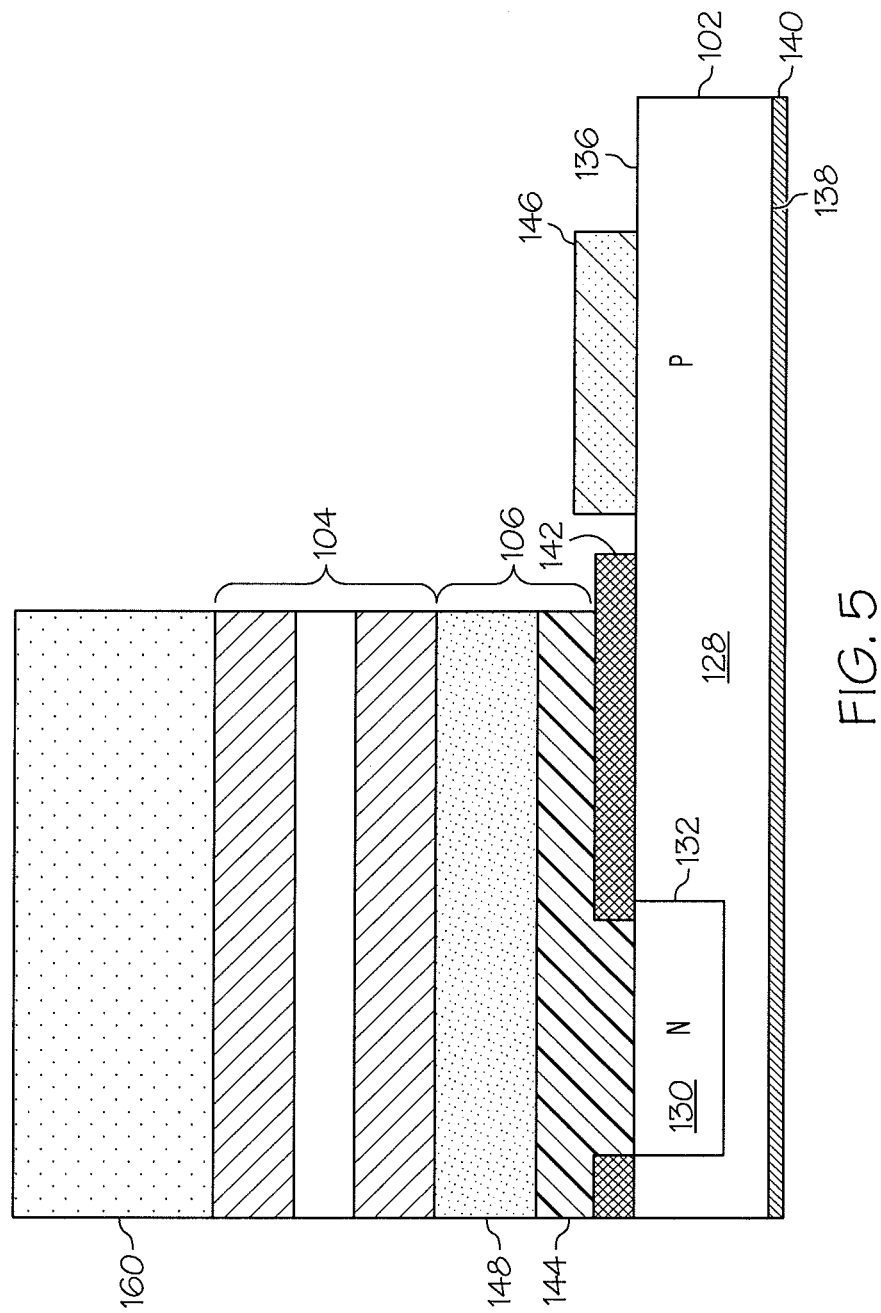
FIG. 5 is a side elevational view, in section, of the inverted metamorphic solar cell of FIG. 4 connected to the carrier of FIG. 2 during the assembly of the solar cell structure of FIG. 1 in accordance with one aspect of the disclosed method for assembling solar cell structures.
Figure 6:
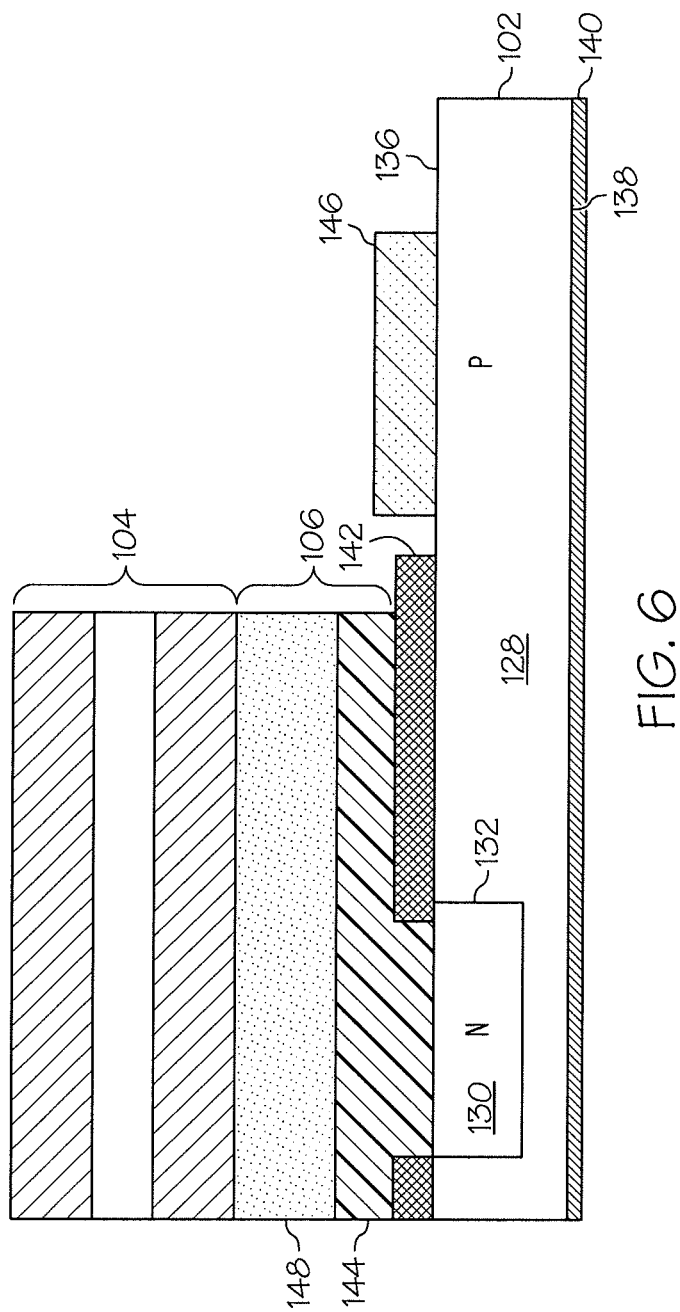
FIG. 6 is a side elevational view, in section, of the solar cell structure of FIG. 5, shown with a temporary substrate layer removed therefrom.

Once the carrier 102 and the solar cell 104 have been separately formed, the method 150 (FIG. 13) may proceed to step 166. At step 166, the metallization layer 148 of the solar cell 104 may be connected to the first connection pad 144 of the carrier 102 to form the metal-to-metal bond 106 between the solar cell 104 and the carrier 102, as shown in FIG. 5. At step 168 (FIG. 13), the temporary carrier 160 may be removed from the solar cell 104, as shown in FIG. 6. The removal of the temporary carrier 160 may be effected using any technique known or available in the art. At step 170 (FIG. 13), the additional layers, such as the front contact metallization layer 108, the anti-reflecting coating layer 110 and the cover glass layer 112, may be layered over the front side 114 of the solar cell 104, as shown in FIG. 1. Then, at step 172 (FIG. 13), the assembly may be heat treated (e.g., sintered) to form the completed solar cell structure 100.

At step 174, the completed solar cell structure 100 may be electrically coupled (e.g., in series) with other solar cell structures 100 by way of the interconnect 134, as shown in FIG. 7 and described above.

Figure 8:
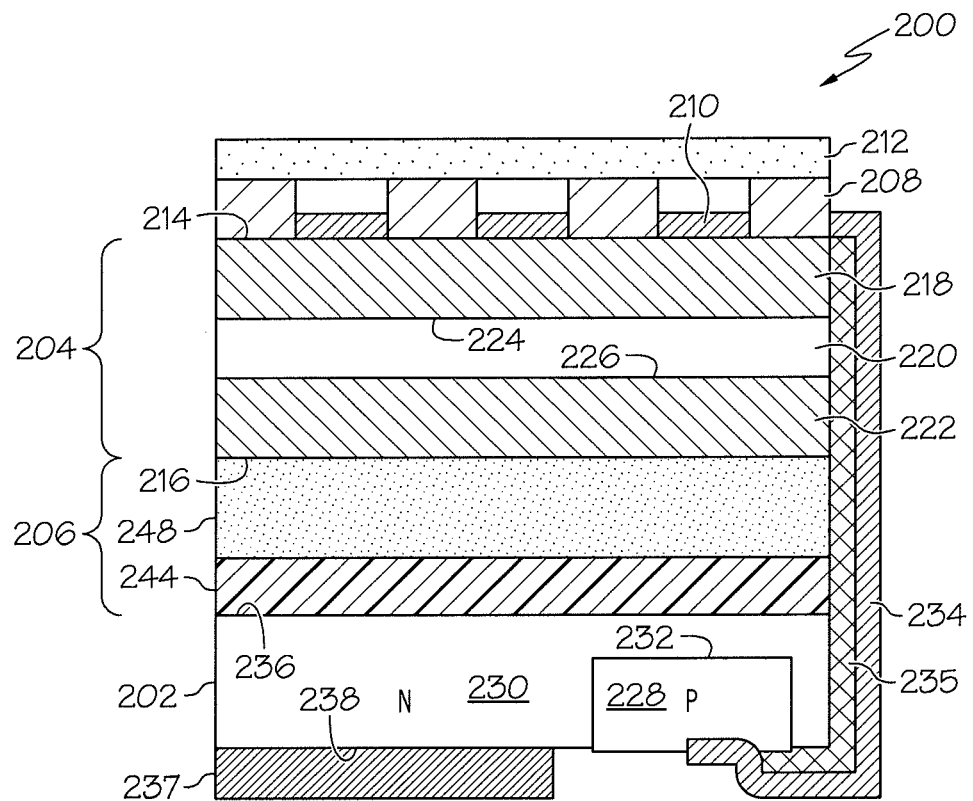
FIG. 8 is a side elevational view, in section, of a second aspect of the disclosed solar cell structure with integral by-pass diode.
Figure 9:
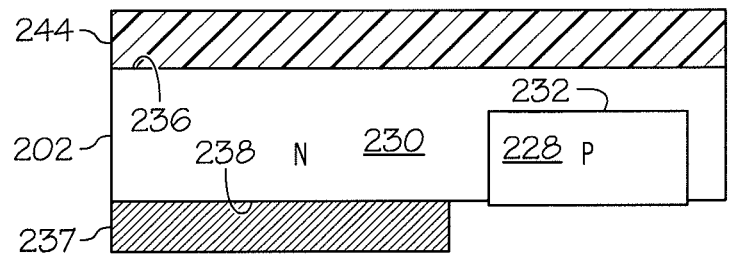
FIG. 9 is a side elevational view, in section, of a carrier of the solar cell structure of FIG. 8, shown with metallization layers.

Referring to FIG. 8, a second aspect of the disclosed solar cell structure, generally designated 200, may include a carrier 202 and a solar cell 204 connected to the carrier 202 by way of a metal-to-metal bond 206. The solar cell structure 200 may also include additional layers, such as a front contact metallization layer 208 (e.g., a grid), an anti-reflecting coating layer 210 and a cover glass layer 212, among other possible additional layers.

The solar cell 204 may include a front side 214 and a back side 216, and may produce a voltage across the front side 214 and the back side 216 when the front side 214 is illuminated. The solar cell 204 may include multiple layers 218, 220, 222 of semiconductor material that define junctions 224, 226 therebetween. Like solar cell 104, in one particular implementation, solar cell 204 may be an inverted metamorphic solar cell.

The carrier 202 may include a front side 236, a back side 238, a portion of P-type semiconductor material 228 and a portion of N-type semiconductor material 230. The P-type portion 228 and the N-type portion 230 of the carrier define at least one P-N junction 232 in the carrier 102.

Both the P-type portion 228 and the N-type portion 230 of the carrier 202 may be exposed on the back side 238 of the carrier 202. The front side 214 of the solar cell 204 may be electrically coupled to the P-type portion 228 of the carrier 202 by way of a wrap-around metallization layer 234, which may be electrically isolated from the back side 216 of the solar cell 204 by way of an insulation layer 235. The back side 216 of the solar cell 204 may be electrically coupled to the N-type portion 230 of the carrier 202 by way of the metal-to-metal bond 206. Therefore, the carrier 202 may advantageously function as a by-pass diode.

Optionally, an additional metallization layer 237 (e.g., a connection pad) may be provided on the back side 238 of the carrier and may be electrically coupled to the N-type portion 230 of the carrier 202.

Figure 12:
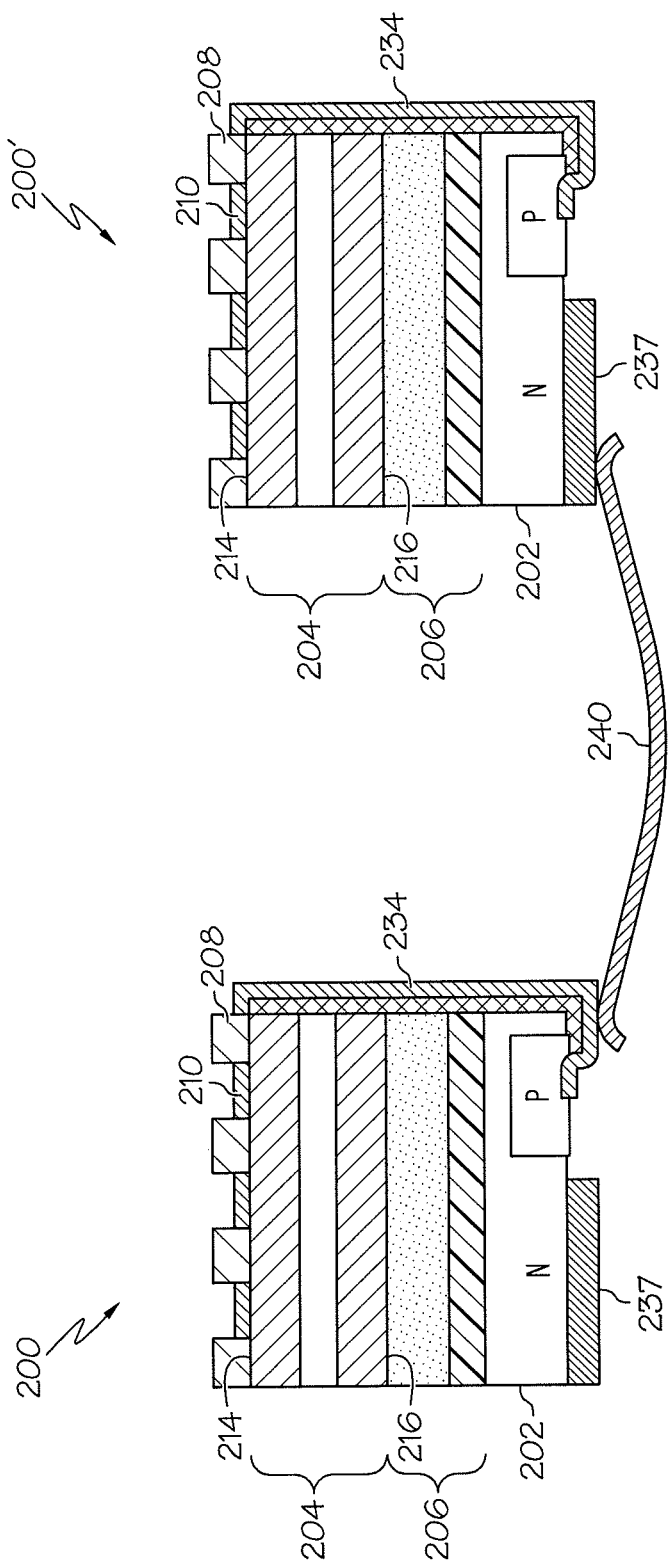
FIG. 12 is a side elevational view, in section, of the solar cell structure of FIG. 8 electrically coupled in series to another solar cell structure.

Thus, as shown in FIG. 12, the solar cell structure 200 may be arranged in an array with other like solar cell structures 200' by using interconnects 240 in an all-rear-contact configuration to electrically couple the front side 214 of the solar cell 204 of solar cell structure 200 with the back side 216 of the solar cell 204 of an adjacent solar cell structure 200' by way of the carrier 202.

Figure 14:
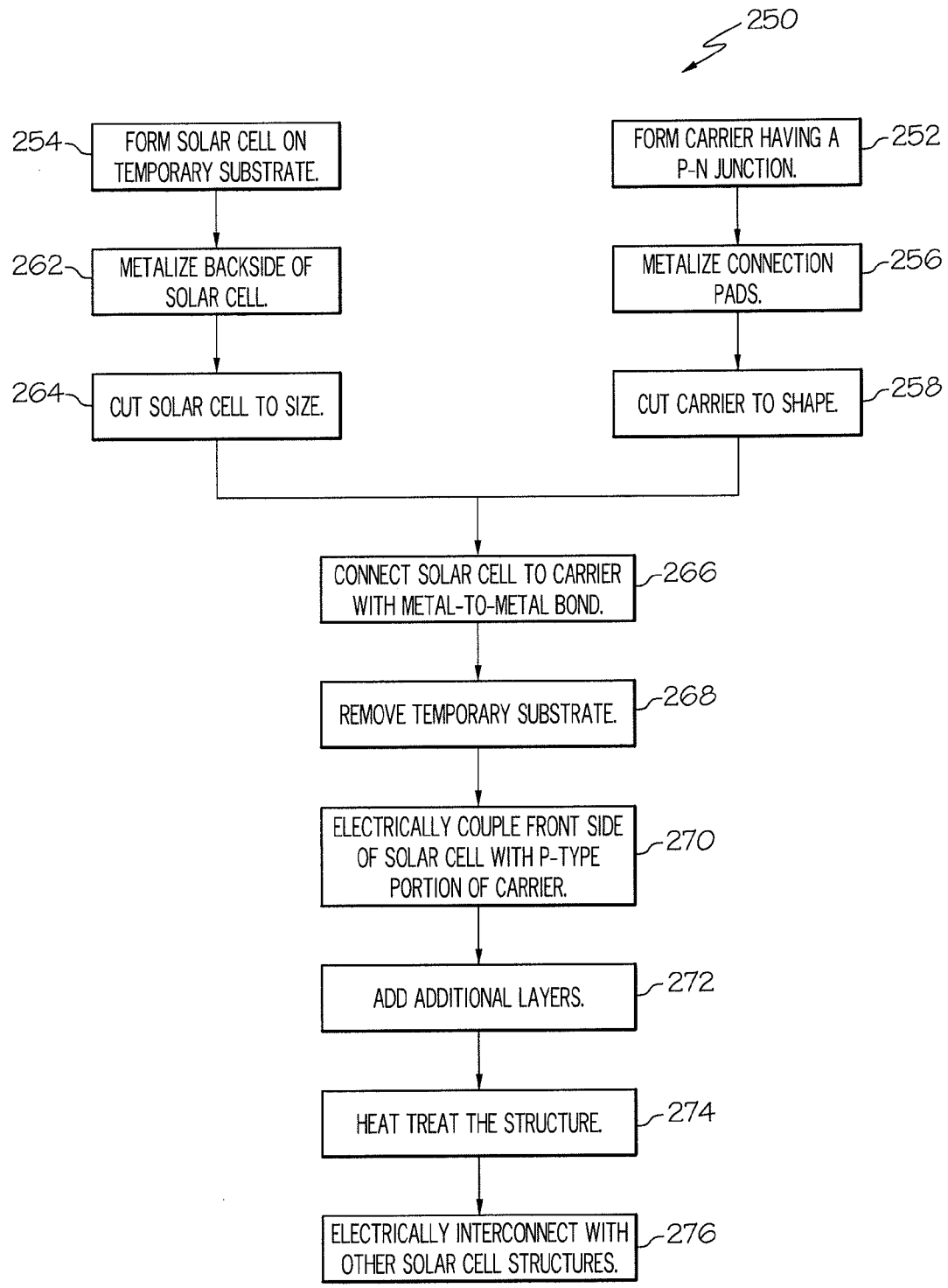
FIG. 14 is a flowchart illustrating a method for assembling the solar cell structure of FIG. 8.

One aspect of the disclosed method for forming solar cell structure 200 is illustrated in FIG. 14 and generally designated 250. The method 250 may begin with the separate formation of the carrier 202 (step 252) and the solar cell 204 (step 254).

At step 252, carrier 202 may be formed with a P-N junction 232 in the same or similar manner as carrier 202. Once the carrier 202 has been formed, the method may proceed to step 256 (FIG. 14), wherein a first metallization layer 244 (e.g., a first connection pad) may be formed on the front side 236 of the carrier 202 and a second metallization layer 237 (e.g., a second connection pad) may be formed on the back side 238 of the carrier 202. Both the first 244 and the second 237 metallization layers may be electrically coupled to the N-type portion 230 of the carrier 202.

With the formation and metallization of the carrier 202 complete, the carrier 202 may be cut to the desired shape and size, as shown in step 258.

Regarding step 254 (FIG. 14), the solar cell 204 may be initially formed on a temporary substrate 260 (FIG. 10) in a manner similar to solar cell 104 shown in FIG. 3. Likewise, at step 262 (FIG. 14), a metallization layer 248 (FIG. 10) may be layered over the back side 216 of the solar cell 204. With the metallization of the solar cell 204 complete, the solar cell 204 and associated metallization layer 248 and temporary substrate 260 may be cut to the desired size and shape, a shown in step 264 (FIG. 14).

Figure 10:
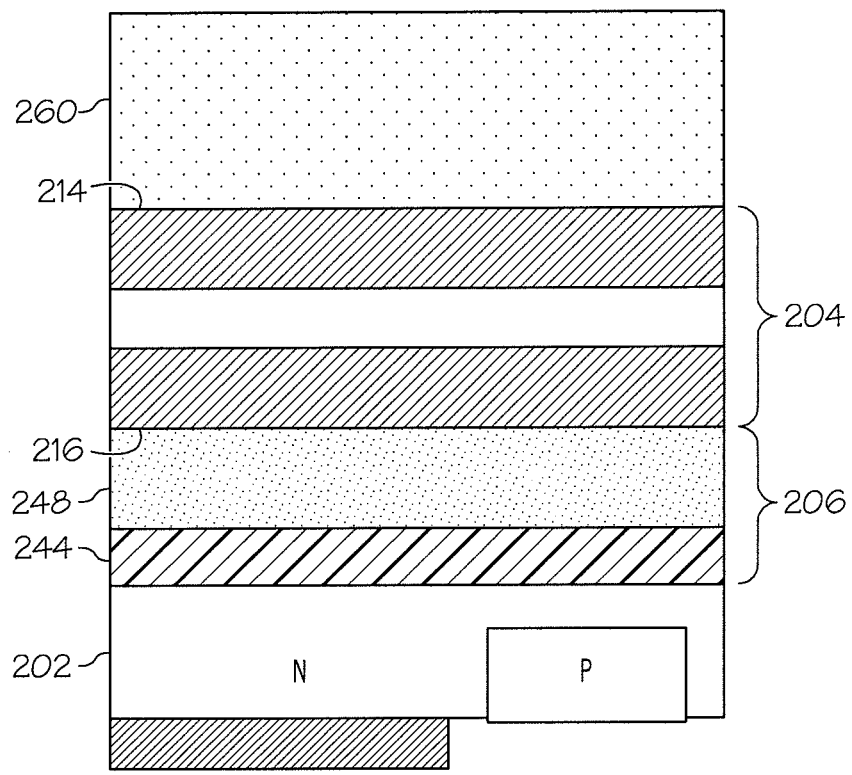
FIG. 10 is a side elevational view, in section, of the inverted metamorphic solar cell of FIG. 4 connected to the carrier of FIG. 9 during the assembly of the solar cell structure of FIG. 8 in accordance with another aspect of the disclosed method for assembling solar cell structures.
Figure 11:
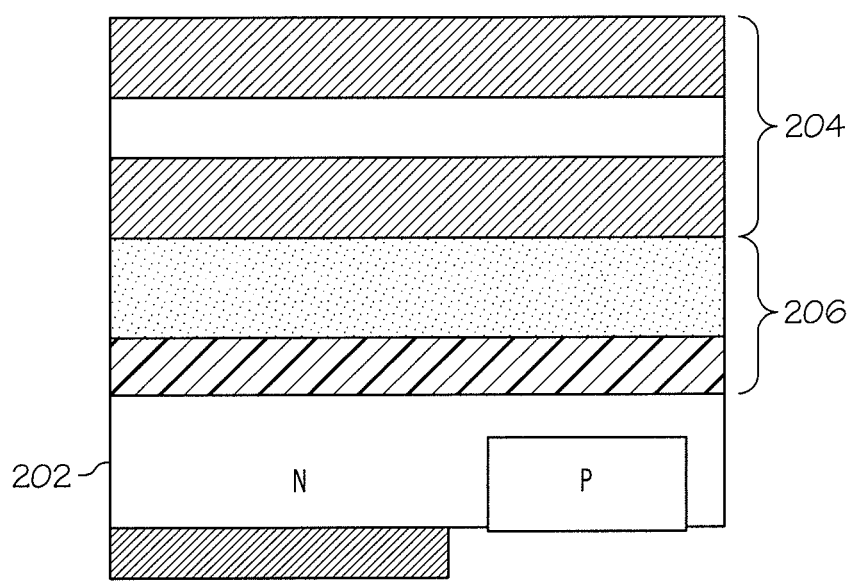
FIG. 11 is a side elevational view, in section, of the solar cell structure of FIG. 10, shown with a temporary substrate layer removed therefrom.

Once the carrier 202 and the solar cell 204 have been separately formed, the method 250 (FIG. 14) may proceed to step 266. At step 266, the metallization layer 248 of the solar cell 204 may be connected to metallization layer 244 of the carrier 202 to form the metal-to-metal bond 206 between the solar cell 204 and the carrier 202, as shown in FIG. 10. At step 268 (FIG. 14), the temporary carrier 260 may be removed from the solar cell 204, as shown in FIG. 11. At step 270 (FIG. 14), insulation layer 235 and wrap-around metallization layer 234 may be applied to electrically couple the front side 214 of the solar cell 204 with the exposed P-type portion 228 of the carrier 202, as shown in FIG. 8. At step 272 (FIG. 14), the additional layers, such as the front contact metallization layer 208, the anti-reflecting coating layer 210 and the cover glass layer 212, may be layered over the front side 214 of the solar cell 204, as shown in FIG. 8. Then, at step 274 (FIG. 14), the assembly may be heat treated (e.g., sintered) to form the completed solar cell structure 200.

At step 276, the completed solar cell structure 200 may be electrically coupled (e.g., in series) with other solar cell structures 200' by way of the interconnect 240, as shown in FIG. 12 and described above.

At this point, those skilled in the art will appreciate that the disclosed solar cell structures and methods for assembling solar cell structures provide advantages over the prior art. As one advantage, the by-pass diode is used as the manufacturing carrier to support the solar cell, thereby eliminating the need for separate carriers and separate by-pass diodes. As another advantage, the integration of the carrier with the by-pass diode may eliminate the need for multiple interconnects. As another advantage, the all-front-contact and all-rear-contact configurations simplify implementation and automation of assembly, and the all-front-contact configuration allows for the back side of the carrier to be fully insulated. In yet another advantage, use of a silicon-based carrier significantly reduces material and manufacturing costs, and provides for relatively increased flexibility of the solar cell structures.

Although various aspects of the disclosed solar cell structure with integral by-pass diode have been shown and described, modifications may occur to those skilled in the art upon reading the specification. The present application includes such modifications and is limited only by the scope of the claims.

What is claimed is:

1. A solar cell array comprising:
a solar cell structure, comprising:
a silicon carrier having a generally flat, planar shape and defining a front side and a back side, and being formed of an N-type material having an exposed portion on said front side of said carrier, and of a P-type material having an exposed portion on said front side of said carrier, said N-type material and said P-type material defining a P-N junction; and
a solar cell defining a front side adapted to receive illumination and a back side opposite said front side, wherein said solar cell is connected to said front side of said silicon carrier so that said back side of said solar cell is mounted on said front side of said silicon carrier such that said front side of said silicon carrier extends along an entire back side of said solar cell and said silicon carrier supports said entire back side of said solar cell, and is thereby electrically coupled to said exposed portion of said N-type material, wherein said exposed portion of said P-type material on said front side of said silicon carrier includes a part that extends beyond said back side of said solar cell, and
an electrical connector electrically coupling said front side of said solar cell to said front side of said silicon carrier along said exposed portion of said P-type material and to a back side of an adjacent solar cell of an adjacent solar cell structure, wherein said electrical connection is an all-front contact configuration where said electrical connection does not contact said back side of said silicon carrier.

2. The solar cell structure of claim 1, wherein said carrier is formed from single crystal silicon.

3. The solar cell structure of claim 1, wherein said solar cell comprises an inverted metamorphic solar cell.

4. The solar cell structure of claim 1, further comprising a wire interconnect that electrically couples said front side of said solar cell to a second connection pad on said part of said exposed portion of said P-type material that extends beyond said back of said solar cell.

5. The solar cell structure of claim 1, further comprising a first metallization layer positioned over said exposed portion of said N-type material and a second metallization layer positioned over said exposed portion of said P-type material.

6. The solar cell structure of claim 1, wherein said back side of said carrier includes an insulation layer connected thereto.

7. An array of the solar cell structures of claim 1 interconnected in series.

* * * * *

UNITED STATES PATENT AND TRADEMARK OFFICE
CERTIFICATE OF CORRECTION

| | | |
|---|---|---|
| PATENT NO. | : 8,878,048 B2 | Page 1 of 1 |
| APPLICATION NO. | : 12/781219 | |
| DATED | : November 4, 2014 | |
| INVENTOR(S) | : Frank F. Ho et al. | |

It is certified that error appears in the above-identified patent and that said Letters Patent is hereby corrected as shown below:

In the Specification:

Column 1, Lines 7-10, should read as follows:
-- This invention was made with Government support under contract number HR0011-08-C-0086 awarded by Defense Advanced Research Projects Agency. The government has certain rights in this invention. --

Signed and Sealed this
Tenth Day of November, 2015

Michelle K. Lee
*Director of the United States Patent and Trademark Office*